United States Patent
Zhou et al.

(10) Patent No.: US 11,619,563 B2
(45) Date of Patent: Apr. 4, 2023

(54) OPTICAL PATH TEST SYSTEM AND METHOD FOR RETURN LIGHT RESISTANCE OF LASER CHIP

(71) Applicant: Shenzhen Xing Han Laser Technology Co.Ltd., Shenzhen (CN)

(72) Inventors: Shao Feng Zhou, Shenzhen (CN); Peng Liu, Shenzhen (CN); Shu ping Wang, Shenzhen (CN); Chun bao Ouyang, Shenzhen (CN)

(73) Assignee: SHENZHEN XING HAN LASER TECHNOLOGY CO.LTD., Shenzhen (CN)

( * ) Notice: Subject to any disclaimer, the term of this patent is extended or adjusted under 35 U.S.C. 154(b) by 0 days.

(21) Appl. No.: 17/571,545

(22) Filed: Jan. 10, 2022

(65) Prior Publication Data
US 2022/0221371 A1 Jul. 14, 2022

(30) Foreign Application Priority Data
Jan. 11, 2021 (CN) .......................... 202110030943.9

(51) Int. Cl.
G01M 11/02 (2006.01)
H01S 5/065 (2006.01)
H01S 5/00 (2006.01)

(52) U.S. Cl.
CPC .... *G01M 11/0207* (2013.01); *G01M 11/0242* (2013.01); *H01S 5/0656* (2013.01); *H01S 5/005* (2013.01); *H01S 5/0071* (2013.01)

(58) Field of Classification Search
CPC ...... H01S 3/0014; H01S 5/0656; H01S 5/005; H01S 5/0071; H01S 5/0014;
(Continued)

(56) References Cited

U.S. PATENT DOCUMENTS

| | | | | |
|---|---|---|---|---|
| 5,589,684 A | * | 12/1996 | Ventrudo | ........... G02B 6/02076 250/225 |
| 2002/0118904 A1 | * | 8/2002 | Man | ..................... G02B 6/4209 385/11 |

(Continued)

FOREIGN PATENT DOCUMENTS

| CN | 204028412 U | * | 12/2014 | ............... G02B 6/42 |
|---|---|---|---|---|
| CN | 110718852 A | * | 1/2020 | ............... H01S 5/06 |
| CN | 111934194 A | * | 11/2020 | ............. H01S 5/026 |

*Primary Examiner* — Tarifur R Chowdhury
*Assistant Examiner* — Noah J. Haney
(74) *Attorney, Agent, or Firm* — Andrew C. Cheng

(57) ABSTRACT

An optical path test system includes a return light test unit for emitting laser light to an optical path monitoring unit to simulate return light received by the optical path monitoring unit in a normal operation; a light path monitoring unit arranged on a light path of the return light testing unit for receiving the return light and normally emitting laser light; and a power detector for receiving the laser light emitted by the light path monitoring unit so as to monitor stability of output power of the chip when the light path monitoring unit receives the return light emitted by the return light testing unit. The technical solution in the present invention emits laser light to a tested laser chip to simulate return light received by the tested laser chip in a normal operation, and a return light resistance threshold of the laser chip can be accurately evaluated.

8 Claims, 3 Drawing Sheets

(58) Field of Classification Search
CPC ........ H01S 5/0021; H01S 5/0035; H01S 5/06; H01S 5/068; H01S 5/0683; G01M 11/0207; G01M 11/0242; G01J 1/4257; G01K 17/003
USPC .......................................................... 356/618
See application file for complete search history.

(56) References Cited

U.S. PATENT DOCUMENTS

2006/0280220 A1* 12/2006 Yoo ..................... H01S 5/183
372/99
2014/0176958 A1* 6/2014 Flanders ................ H01S 5/06
372/20

* cited by examiner

```
┌─────────────────────────────────────────────────────────────────┐
│ supplying electricity from an external electricity source to a  │
│ first laser chip and a second laser chip, so that the first     │
│ laser chip generates laser light of a normal operation to serve │──── S101
│ as a first light beam, and the second laser chip generates      │
│ laser light to serve a simulated return light beam; the first   │
│ light beam and the return light beam being both P-polarized     │
│ light                                                           │
└─────────────────────────────────────────────────────────────────┘
                              │
                              ▼
┌─────────────────────────────────────────────────────────────────┐
│ the first light beam traveling along an optical path formed of  │
│ a first fast axis collimating lens, a first slow axis           │
│ collimating lens, a first reflector, a polarization beam        │──── S102
│ combiner, a fast axis collimating lens, a slow axis             │
│ collimating lens, and an output optic fiber to reach a power    │
│ detector                                                        │
└─────────────────────────────────────────────────────────────────┘
                              │
                              ▼
┌─────────────────────────────────────────────────────────────────┐
│ the simulated return light beam traveling along an optical path │
│ formed of a second fast axis collimating lens, a second slow    │
│ axis collimating lens, a second reflector, a polarization beam  │
│ combiner, a first reflector, a first slow axis collimating      │──── S103
│ lens, and a first fast axis collimating lens to reach the first │
│ laser chip, in order to simulate return light that is received  │
│ by the first laser chip in a normal operation                   │
└─────────────────────────────────────────────────────────────────┘
                              │
                              ▼
┌─────────────────────────────────────────────────────────────────┐
│ gradually increasing an input electrical current of the second  │
│ laser chip to vary power of the simulated return light beam,    │
│ and at the same time, the power detector continuously           │
│ performing monitoring on an output power varying condition of   │──── S104
│ the first laser chip by receiving the first light beam, in      │
│ order to test stability of output power of the first laser chip │
│ under a condition that the power of the simulated return light  │
│ received thereby is continuously increasing                     │
└─────────────────────────────────────────────────────────────────┘
```

FIG. 3

OPTICAL PATH TEST SYSTEM AND METHOD FOR RETURN LIGHT RESISTANCE OF LASER CHIP

FIELD OF THE INVENTION

The present invention relates to the technical field of semiconductor laser devices, and more particularly to an optical path test system and method for return light resistance of a laser chip.

DESCRIPTION OF THE RELATED ART

With the development of laser technology and increase of output power level of lasers, the performance of a laser chip in resisting return light is increasingly demanded, in which during a normal operation of a laser chip, there is always a minor amount of laser light returning along the original path back to the laser chip. The intensity of the return light might cause the laser chip to burn out if reaching a certain level, and consequently affecting the performance of the laser device. Thus, accurately evaluating the performance of a laser chip in resisting return light is a premise condition for utilization of the laser chip.

SUMMARY OF THE INVENTION

To resolve the above issue, the present invention provides an optical path test system and method for return light resistance of a laser chip, which enable accurate evaluation of a threshold of a laser chip for return light resistance in a normal operation.

An optical path test system for return light resistance of a laser chip comprises a light path monitoring unit, a return light test unit, and a power detector; the return light test unit is operable to emit laser toward the light path monitoring unit to simulate return light that the light path monitoring unit receives in a normal operation condition; the light path monitoring unit is arranged on a light exiting direction of the return light test unit to receive return light and meanwhile normally emitting laser light; the power detector is connected through an optic fiber to the light path monitoring unit and is operable to receive the laser light emitted from the light path monitoring unit in order to monitor stability of power output of the light path monitoring unit during receipt of the return light emitted from the return light test unit.

Further, the light path monitoring unit comprises a first laser chip, a polarization beam combiner, and an output optic fiber; laser light emitted from the first laser chip in a normal operation is a first light beam; the polarization beam combiner allows the first light beam to transmit therethrough to the output optic fiber to be transmitted through the optic fiber to the power detector; the return light test unit comprises a second laser chip, and laser light emitted from the second laser chip is a return light beam, the polarization beam combiner reflecting the return light beam to the first laser chip to simulate return light received by the first laser chip in a normal operation.

Further, the first light beam and the return light beam are both P light.

Further, the polarization beam combiner comprises: a first light incidence surface, which receives the first light beam; a second light incidence surface, which receives the return light beam; a half-wave plate being attached to the second light incidence surface; a combining surface, the combining surface being coated with a P-light-transmitting and S-light-reflecting film that allows the first light beam to transmit therethrough and reflects the return light beam of which a polarization direction has been changed by the half-wave plate, the return light beam reflected by the combining surface to transmit into the first laser chip; and a light exiting surface, which functions to output the first light beam transmitting through the combining surface.

Further, the first light beam and the return light beam are both S light.

Further, the polarization beam combiner comprises: a first light incidence surface, which receives the first light beam; a second light incidence surface, which receives the return light beam; a half-wave plate being attached to the second light incidence surface; a combining surface, the combining surface being coated with an S-light-transmitting and P-light-reflecting film that allows the first light beam to transmit therethrough and reflects the return light beam of which a polarization direction has been changed by the half-wave plate, the return light beam reflected by the combining surface transmitting into the first laser chip; and a light exiting surface, which functions to output the first light beam transmitting through the combining surface.

Further, the polarization beam combiner comprises: a first light incidence surface, which receives the first light beam; a half-wave plate being attached to the first light incidence surface; the first light beam transmitting through the first light incidence surface into the polarization beam combiner and being converted from S light into P light; a second light incidence surface, which receives the return light beam; a combining surface, the combining surface being coated with a P-light-transmitting and S-light-reflecting film that allows the first light beam of which a polarization direction has been changed by the half-wave plate to transmit therethrough and reflects the return light beam, the return light beam reflected by the combining surface transmitting into the first laser chip; and a light exiting surface, which functions to output the first light beam transmitting through the combining surface.

The present invention also provides an optical path test method for return light resistance of a laser chip, which is characterized by comprising the following steps:

supplying electricity from an external electricity source to a first laser chip and a second laser chip, so that the first laser chip generates laser of a normal operation to serve as a first light beam, and the second laser chip generates laser to serve a return light beam; the first light beam and the return light beam being both P light; the first light beam traveling along an optical path formed of a first fast axis collimating lens, a first slow axis collimating lens, a first reflector, a polarization beam combiner, a fast axis collimating lens, a slow axis collimating lens, and an output optic fiber to reach a power detector; the return light beam traveling along an optical path formed of a second fast axis collimating lens, a second slow axis collimating lens, a second reflector, a polarization beam combiner, a first reflector, a first slow axis collimating lens, and a first fast axis collimating lens to reach the first laser chip, in order to simulate return light that is received by the first laser chip in a normal operation; and gradually increasing an input electrical current of the second laser chip to vary power of the return light beam, and at the same time, the power detector continuously performing monitoring on an output power varying condition of the first laser chip by receiving the first light beam, in order to test stability of output power of the first laser chip under a condition that the power of the return light received thereby is continuously increasing.

Further, the power detector continuously performs monitoring on the output power varying condition of the first laser chip such that in case that the monitoring performed by the power detector identifies the output power of the first laser chip becomes 0, the first laser chip burns out, and the output power of the second laser chip at the moment is recorded as a performance threshold of the first laser chip in respect of resistance against return light in a normal operation.

An advantageous effect that the technical solution provided in the present invention brings on is that the technical solution provided in the present invention emits laser toward a laser chip under test to simulate return light that the laser chip under test will receive in a normal operation, so that a threshold of the laser chip in respect of return light resistance can be accurately evaluated, this being of important meaning for design and fabrication of laser chips.

BRIEF DESCRIPTION OF THE DRAWINGS

To more clearly illustrate the technical solutions presented in the embodiments of the present invention or those of the prior art, the following provides a brief description to the drawings that are essential for the illustration of technical solutions presented in the embodiments or those of the prior art. It is obvious that the drawings of which the description provided below are just for some of the embodiments of the present invention, and for those having ordinary skill in the art, other drawings can be contemplated from theses without paying creative endeavor.

FIG. 3 is a flow chart illustrating an optical path test system for return light resistance of a laser chip according to an embodiment of the present invention;

DETAILED DESCRIPTION OF PREFERRED EMBODIMENTS OF THE INVENTION

For better understanding of objectives, technical solutions, and advantages of the present invention, the following provides a clear and complete description of the technical solution provided in embodiments of the present invention with reference to the embodiments of the present invention and the drawings. It is certain that the described embodiments are just some, but not all, of the embodiments of the present invention. Based on the embodiments of the present invention, those having ordinary skill in the art may, without paying creative endeavor, contemplate all the remaining embodiments, which all belong to the scope of protection of the present invention.

For bettering understanding of the technical features, the objectives, and the effectiveness of the present invention, certain ways of embodying the present invention will be described in detail, with reference to the attached drawings.

Embodiment 1

Figure 1:
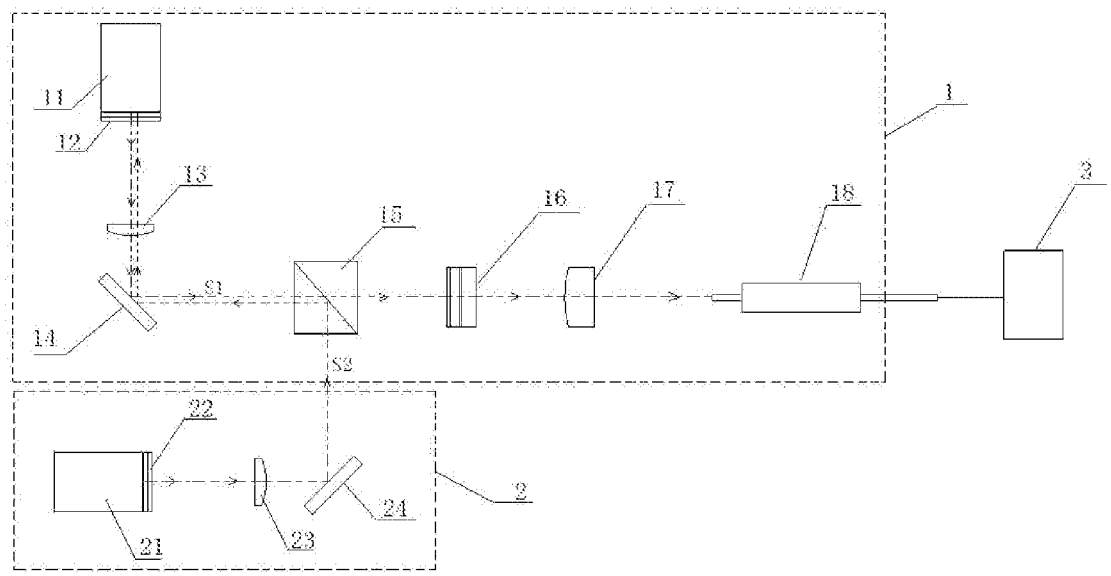
FIG. 1 is a schematic view illustrating an optical path test system for return light resistance of a laser chip according to an embodiment of the present invention.

The instant embodiment provides an optical path test system and method for return light resistance of a laser chip. Referring to FIG. 1, FIG. 1 is a schematic view illustrating an optical path test system for return light resistance of a laser chip according to an embodiment of the present invention. The present invention provides, in an embodiment, an optical path test system for return light resistance of a laser chip, which comprises: a light path monitoring unit 1, a return light test unit 2, and a power detector 3.

The return light test unit 2 is operable to emit laser light toward the light path monitoring unit 1 to simulate return light that the light path monitoring unit 1 receives in a normal operation condition. The light path monitoring unit 1 is arranged on a light exiting direction of the return light test unit 2 to receive simulated return light, while at the same time normally emitting laser. The power detector 3 is connected by an optic fiber to the light path monitoring unit 1 and receives the laser emitted from the light path monitoring unit 1 in order to monitor the stability of power output of the light path monitoring unit 1 during receipt of the simulated return light emitted from the return light test unit 2.

The light path monitoring unit 1 comprises: a first laser chip 11, a first fast axis collimating lens 12, a first slow axis collimating lens 13, a first reflector 14, a polarization beam combiner 15, a fast axis focusing lens 16, a slow axis focusing lens 17, and an output optic fiber 18.

The laser light that is emitted by the first laser chip 11 in a normal operation is taken as a first light beam S1. The first fast axis collimating lens 12 is arranged on a light exiting direction of the first laser chip 11 to collimate the first light beam S1 in a fast axis direction of the first light beam S1. The first slow axis collimating lens 13 is arranged on a light exiting direction of the first fast axis collimating lens 12 to collimate the first light beam S1 in a slow axis direction of the first light beam S1. The first reflector 14 is arranged on a light exiting direction of the first slow axis collimating lens 13 to reflect the fast axis/slow axis-collimated first light beam S1 to the polarization beam combiner 15. The polarization beam combiner 15 is arranged on a light exiting direction of the first reflector 14, and the first light beam S1 directly transmits through the polarization beam combiner 15. The fast axis focusing lens 16 is arranged on a light exiting direction of the polarization beam combiner 15 to receive the first light beam S1 outputted from the polarization beam combiner 15 for focusing in the fast axis direction. The slow axis focusing lens 17 is arranged on a light exiting direction of the fast axis focusing lens 16 to receive the fast axis-focused first light beam S1 for focusing in the slow axis direction. The output optic fiber 18 is arranged on a light exiting direction of the slow axis focusing lens 17 to receive the fast axis/slow axis-focused first light beam S1 and transmit the first light beam S1 to the power detector 3.

The return light test unit 2 comprises: a second laser chip 21, a second fast axis collimating lens 22, a second slow axis collimating lens 23, and a second reflector 24.

The laser light that is emitted by the second laser chip 21 is taken as a simulated return light beam S2 to simulate a return light received by the first laser chip 11 in a normal operation. The second fast axis collimating lens 22 is arranged on a light exiting direction of the second laser chip 21 to collimate the simulated return light beam S2 in a fast axis direction of the simulated return light beam S2. The second slow axis collimating lens 23 is arranged on a light exiting direction of the second fast axis collimating lens 22 to collimate the simulated return light beam S2 in a slow axis direction of the simulated return light beam S2. The second reflector 24 is arranged on a light exiting direction of the second slow axis collimating lens 23 to reflect the fast axis/slow axis-collimated simulated return light beam S2 to the polarization beam combiner 15. The polarization beam combiner 15 is arranged on a light exiting direction of the second reflector 24.

In the instant embodiment, the first light beam S1 and the simulated return light beam S2 are both P-polarized light.

Figure 2:
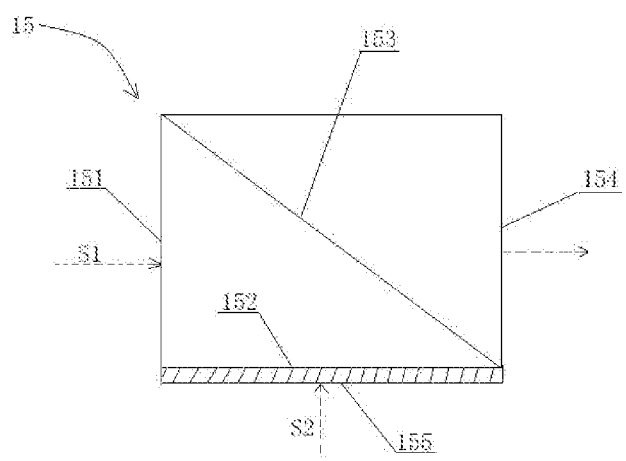
FIG. 2 is a schematic view showing a polarization beam combiner according to a first embodiment of the present invention.

Referring to FIG. 2, FIG. 2 is a structural view of the polarization beam combiner 15 according to the instant embodiment. The polarization beam combiner 15 is formed by cementing two prisms that are arranged opposite to each other and comprises: a first light incidence surface 15, which receives the first light beam S1; a second light incidence surface 152, which receives the return light beam S2; a half-wave plate 155 attached to the second light incidence surface 152, a combining surface 153, and a light exiting surface 154. The half-wave plate 155 functions to rotate a polarization direction of the return light beam S2 by 90°. The combining surface 153 is coated with a P-polarized light transmitting and S-light (S-polarized light)-reflecting film to allow the first light beam S1 to transmit therethrough and reflect the simulated return light beam S2 of which the polarization direction has been changed by the half-wave plate 155. The light exiting surface 154 functions to output the first light beam S1 transmitting through the combining surface 153. The first light incidence surface 151 and the second light incidence surface 152 are perpendicular to each other and are located on a same prism. The light exiting surface 154 and the first light incidence surface 151 are parallel to each other. The combining surface 153 is located at a cementing site of the prisms.

The simulated return light beam S2 reflected by combining surface 153 travels, in sequence, through the first reflector 14, the first slow axis collimating lens 13, and the first fast axis collimating lens 12 to get into the first laser chip 11.

Referring to FIG. 3, FIG. 3 is a flow chart illustrating an optical path test system for return light resistance of a laser chip according to an embodiment of the present invention, and specifically comprises the following steps:

S101: supplying electricity from an external electricity source to the first laser chip 11 and the second laser chip 21, so that the first laser chip 11 generates the first light beam S1 and the second laser chip 21 generates the simulated return light beam S2; the first light beam S1 and the simulated return light beam S2 being both P-polarized light;

S102: the first light beam S1 traveling along an optical path formed of the first fast axis collimating lens 12, the first slow axis collimating lens 13, the first reflector 14, the polarization beam combiner 15, the fast axis collimating lens 16, the slow axis collimating lens 17, and the output optic fiber 18 to reach the power detector 3;

S103: the simulated return light beam S2 traveling along a optical path formed of the second fast axis collimating lens 22, the second slow axis collimating lens 23, the second reflector 24, the polarization beam combiner 15, the first reflector 14, the first slow axis collimating lens 13, and the first fast axis collimating lens 12 to reach the first laser chip 11 in order to simulate return light that is received by the first laser chip 11 in a normal operation condition;

S104: gradually increasing an input electrical current of the second laser chip 21 to vary power of the simulated return light beam S2, and at the same time, the power detector 3 continuously performing monitoring on an output power varying condition of the first laser chip 11 by receiving the first light beam S1, in order to test stability of output power of the first laser chip 11 under a condition the power of the simulated return light received thereby is continuously increasing;

In Step S103, the first light incidence surface 151 of the polarization beam combiner 15 receives the first light beam S1, the second light incidence surface 152 receives the return light beam.

The simulated return light beam S2 outputted from the second laser chip 21 is subjected, in sequence, to be collimated in the fast axis direction by the second fast axis collimating lens 22, to be collimated in the slow axis direction by the second slow axis collimating lens 23, and then to be reflected by the second reflector 24 to transmit through the second light incidence surface 152 to enter the polarization beam combiner 15. The polarization direction of the return light beam S2 is rotated 90° by the half-wave plate 155 attached to the second light incidence surface 152 to convert into S-polarized light. The simulated return light beam S2 that is converted into S light is reflected by the combining surface 153 of the polarization beam combiner 15 to the first reflector 14 to then travel through the first slow axis collimating lens 13 and the first fast axis collimating lens 12 to get into the first laser chip 11.

In Step S104, in case that the monitoring performed by the power detector 3 identifies the output power of the first laser chip 11 becomes 0, meaning the first laser chip 11 burns out, the output power of the second laser chip 21 of this moment is recorded to serve as a performance threshold of the first laser chip 11 in respect of resistance against return light in a normal operation.

Embodiment 2

In the instant embodiment the first light beam S1 and the return light beam S2 are both S-polarized light. The combining surface of the polarization beam combiner is coated with an S-light-transmitting and P-light-reflecting film to allow the first light beam S1 to transmit therethrough and reflect the simulated return light beam S2 of which the polarization direction has been changed by the half-wave plate 155.

Embodiment 3

Figure 4:
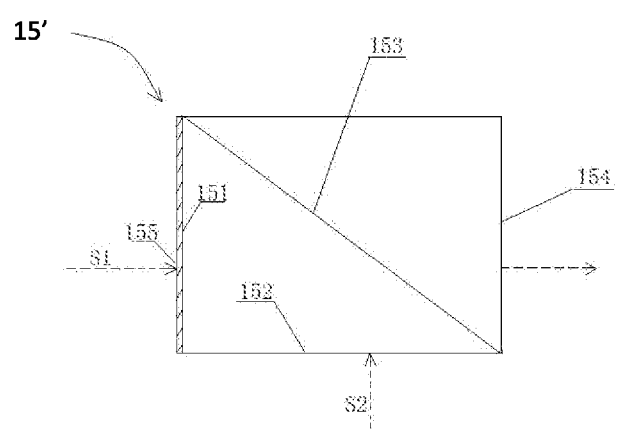
FIG. 4 is a schematic view showing a polarization beam combiner according to a second embodiment of the present invention.

Referring to FIG. 4, in embodiment 3, the half-wave plate 155 is attached to the first light incidence surface 151 to form a new polarization beam combiner 15' according to the instant embodiment. In the instant embodiment, the first light beam and the simulated return light beam are both S-polarized light. The combining surface 153 is coated with a P-light-transmitting and S-light-reflecting film to allow the first light beam S1 of which the polarization direction has been changed by the half-wave plate 155 and reflect the return light beam S2.

Any portions of the instant embodiment that have not been discussed herein are identical to those of EMBODIMENT 1 and repeated description will be omitted herein.

In using the optical path test system according to the instant embodiment to test the performance of the first laser chip 11 in respect of return light resistance: in Step S103, the first light beam S1 is subjected, in sequence, to collimating in a fast axis direction by the first fast axis collimating lens 12, and collimating in a slow axis direction by the first slow axis collimating lens 13, and is then reflected by the first reflector 14 to transmit through the first light incidence surface 151 to enter the polarization beam combiner 15, and the polarization direction of the first light beam S1 is rotated 90° by the half-wave plate 155 attached to the first light incidence surface 151, and is converted in to P light. The first light beam S1 that is converted into P light, after transmitting through the combining surface 153, is outputted from the light exiting surface 154. The first light beam S1 outputted from the light exiting surface 154 is coupled into the output optic fiber 18 and transmitted through the optic fiber to the power detector 3. At the same time, the simulated return light beam S2 outputted from the second laser chip 21 is subjected, in sequence, to be collimated in a fast axis direction by the second fast axis collimating lens 22, and to be collimated in a slow axis direction by the second slow axis collimating lens 23, and is then reflected by the second reflector 24 to transmit through the second light incidence surface 152 to enter the polarization beam combiner 15 to be reflected by the combining surface 153 to the first reflector 14 to then travel through the first slow axis collimating lens 13 and the first fast axis collimating lens 12 to get into the first laser chip 11 to simulate the return light that is received by the first laser chip 11 in a normal operation condition.

It is further noted that in FIGS. 1, 2, and 4 that are involved in the embodiments described above, the optical paths indicated by phantom lines are presented in a simplified schematic form, and do not reflect an actual form of light beams emitted by laser chips in actual operations.

An advantageous effect of the present invention is that the technical solution provided in the present invention emits laser toward a laser chip under test to simulate return light that the laser chip under test will receive in a normal operation, so that a threshold of the laser chip in respect of return light resistance can be accurately evaluated, this being of important meaning for design and fabrication of laser chips.

It is finally noted that the embodiments provided above are just provided for explaining the technical solutions of the present invention, and are not intended to impose limitation thereto. Although the detailed description of the present invention is made with reference to the above illustrated embodiments, those having ordinary skill in the art may appreciate that modifications can be made based on the technical solutions described in each of the above-illustrated embodiments, or equivalent substitutions can be made for certain technical features thereof, and such modifications and substitutions do not result in deviation or departure of the technical solutions thereof from the spirit and scope of the technical solution provided in each embodiments of the present invention.

What is claimed is:

1. An optical path test system for return light resistance of a laser chip, comprising:
    a light path monitoring unit, a return light test unit, and a power detector;
        the return light test unit being operable to emit laser light toward the light path monitoring unit to simulate return light that the light path monitoring unit receives in a normal operation condition;
        the light path monitoring unit being arranged on a light exiting direction of the return light test unit to receive simulated return light and meanwhile normally emitting laser light;
        the power detector being connected through an optic fiber to the light path monitoring unit and operable to receive the laser light emitted from the light path monitoring unit in order to monitor stability of power output of the light path monitoring unit during receipt of the simulated return light emitted from the return light test unit;
        the light path monitoring unit comprising a first laser chip, a polarization beam combiner, and an output optic fiber; laser light emitted from the first laser chip in a normal operation being a first light beam; the polarization beam combiner allowing the first light beam to transmit therethrough to the output optic fiber to be transmitted through the optic fiber to the power detector;
        the return light test unit comprising a second laser chip, laser light emitted from the second laser chip being the simulated return light beam, the polarization beam combiner reflecting the simulated return light beam to the first laser chip to simulate return light received by the first laser chip in a normal operation.

2. The optical path test system for return light resistance of a laser chip according to claim 1, wherein the first light beam and the return light beam are both P-polarized light.

3. The optical path test system for return light resistance of a laser chip according to claim 2, wherein the polarization beam combiner comprises:
    a first light incidence surface configured to receive the first light beam;
    a second light incidence surface configured to receive the simulated return light beam; a half-wave plate being attached to the second light incidence surface;
    a combining surface, the combining surface being coated with a P-light-transmitting and S-light-reflecting film that allows the first light beam to transmit therethrough and reflects the return light beam of which a polarization direction has been changed by the half-wave plate, the simulated return light beam reflected by the combining surface to be transmitted into the first laser chip; and
    a light exiting surface configured to output the first light beam transmitting through the combining surface.

4. The optical path test system for return light resistance of a laser chip according to claim 1, wherein the first light beam and the return light beam are both S light.

5. The optical path test system for return light resistance of a laser chip according to claim 4, wherein the polarization beam combiner comprises:
    a first light incidence surface configured to receive the first light beam;
    a second light incidence surface configured to receive the return light beam;
    a half-wave plate being attached to the second light incidence surface;
    a combining surface, the combining surface being coated with an S-light-transmitting and P-light-reflecting film that allows the first light beam to transmit therethrough and reflects the return light beam of which a polarization direction has been changed by the half-wave plate, the return light beam reflected by the combining surface transmitting into the first laser chip; and
    a light exiting surface configured to output the first light beam transmitting through the combining surface.

6. The optical path test system for return light resistance of a laser chip according to claim 4, wherein the polarization beam combiner comprises:
    a first light incidence surface configured to receive the first light beam; a half-wave plate being attached to the first light incidence surface; the first light beam transmitting through the first light incidence surface into the polarization beam combiner and being converted from S light into P light;
    a second light incidence surface configured to receive the return light beam;
    a combining surface, the combining surface being coated with a P-light-transmitting and S-light-reflecting film that allows the first light beam of which a polarization direction has been changed by the half-wave plate to transmit therethrough and reflects the return light beam, the return light beam reflected by the combining surface transmitting into the first laser chip; and a light exiting surface configured to output the first light beam transmitting through the combining surface.

7. An optical path test method for return light resistance of a laser chip, comprising the following steps:

supplying electricity from an external electricity source to a first laser chip and a second laser chip, so that the first laser chip generates laser light of a normal operation to serve as a first light beam, and the second laser chip generates laser light to serve a simulated return light beam; the first light beam and the return light beam being both P-polarized light;

the first light beam traveling along an optical path formed of a first fast axis collimating lens, a first slow axis collimating lens, a first reflector, a polarization beam combiner, a fast axis collimating lens, a slow axis collimating lens, and an output optic fiber to reach a power detector;

the simulated return light beam traveling along an optical path formed of a second fast axis collimating lens, a second slow axis collimating lens, a second reflector, a polarization beam combiner, a first reflector, a first slow axis collimating lens, and a first fast axis collimating lens to reach the first laser chip, in order to simulate return light that is received by the first laser chip in a normal operation; and gradually increasing an input electrical current of the second laser chip to vary power of the simulated return light beam, and at the same time, the power detector continuously performing monitoring on an output power varying condition of the first laser chip by receiving the first light beam, in order to test stability of output power of the first laser chip under a condition that the power of the simulated return light received thereby is continuously increasing.

8. The optical path test method for return light resistance of a laser chip according to claim 7, wherein the power detector continuously performs monitoring on the output power varying condition of the first laser chip such that in case that the monitoring performed by the power detector identifies the output power of the first laser chip becomes 0, the first laser chip burns out, and the output power of the second laser chip at the moment is recorded as a performance threshold of the first laser chip in respect of resistance against return light in a normal operation.

* * * * *